(12) United States Patent
Lin

(10) Patent No.: US 6,180,487 B1
(45) Date of Patent: Jan. 30, 2001

(54) SELECTIVE THINNING OF BARRIER OXIDE THROUGH MASKED SIMOX IMPLANT

(75) Inventor: Ming-Ren Lin, Cupertino, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/427,134

(22) Filed: Oct. 25, 1999

(51) Int. Cl.[7] .................................................. H01L 21/762
(52) U.S. Cl. ........................................... 438/407; 438/528
(58) Field of Search .................................... 438/219, 295, 438/407, 423, 526, 528, FOR 158, FOR 222

(56) References Cited

U.S. PATENT DOCUMENTS

| | | | |
|---|---|---|---|
| 4,925,805 | * | 5/1990 | Van Ommen et al. . |
| 4,975,126 | | 12/1990 | Margail et al. . |
| 5,488,004 | | 1/1996 | Yang . |
| 5,665,613 | | 9/1997 | Nakashima et al. ................. 438/151 |
| 5,707,899 | | 1/1998 | Cerofolini et al. ................... 438/407 |
| 5,741,717 | | 4/1998 | Nakai et al. . |
| 5,759,907 | | 6/1998 | Assaderaghi et al. ............... 438/386 |
| 5,891,265 | | 4/1999 | Nakai et al. ......................... 148/33.3 |
| 5,918,136 | | 6/1999 | Nakashima ........................... 438/404 |
| 5,956,597 | * | 9/1999 | Furukawa et al. . |
| 5,998,277 | * | 12/1999 | Wu . |

\* cited by examiner

*Primary Examiner*—George Fourson
*Assistant Examiner*—Joannie A. Garcia
(74) *Attorney, Agent, or Firm*—Amin, Eschweiler & Turocy

(57) ABSTRACT

In one embodiment, the present invention relates to a method of forming a Silicon-on-Insulator substrate involving the steps of providing a monocrystalline silicon substrate; patterning a mask over the monocrystalline silicon substrate thereby exposing a portion of the monocrystalline silicon substrate; implanting a first dosage of oxygen atoms in the exposed portion of the monocrystalline silicon substrate; removing the mask from the monocrystalline silicon substrate; implanting a second dosage of oxygen atoms without using an implantation mask in the monocrystalline silicon substrate; and annealing the oxygen implanted monocrystalline silicon substrate to provide the Silicon-on-Insulator substrate. In another embodiment, the present invention relates to a Silicon-on-Insulator structure containing a monocrystalline silicon layer; a buried oxide layer over the monocrystalline silicon layer, the buried oxide layer including a first region having a first thickness and a second region having a second thickness, wherein the first thickness is from about 30% to about 70% smaller than the second thickness; a silicon device layer over the buried oxide layer; and a heat generating device on the silicon device layer and positioned over the first region of the buried oxide layer.

17 Claims, 2 Drawing Sheets

SELECTIVE THINNING OF BARRIER OXIDE THROUGH MASKED SIMOX IMPLANT

TECHNICAL FIELD

The present invention generally relates to improved Silicon-on-Insulator devices. More particularly, the present invention relates to methods for removing heat from Silicon-on-Insulator devices and devices having such characteristics.

BACKGROUND ART

Silicon-on-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer (device region) for formation of the active devices over an insulating layer, such as an oxide, which is in turn formed over a substrate. Transistor sources and drains are fonned, for example, by implantations into the silicon layer while transistor gates are formed by forming a patterned oxide and conductor layer structure.

Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). Devices, such as metal oxide silicon field effect transistors (MOSFET), have a number of advantages when formed on SOI wafers versus bulk silicon MOS transistors. These advantages include: reduced source/drain capacitance and hence improved speed performance at higher-operating frequencies; reduced N$^+$ to P$^+$ spacing and hence higher packing density due to ease of isolation; absence of latchup; lower voltage applications; and higher "soft error" upset immunity (i.e., the immunity to the effects of alpha particle strikes).

Although there are significant advantages associated with SOI technology, there are significant disadvantages as well. For example, poor heat removal from devices on an SOI substrate is a significant disadvantage. Electrical devices generate heat, and the inability to remove or dissipate the heat results in poor and/or inconsistent performance of the electrical devices, or even in some instances device and/or substrate degradation.

There is poor heat removal for devices on SOI substrates primarily because of the oxide insulation layer. This is because the oxide insulation layer has a markedly lower thermal conductivity than the thermal conductivity of conventional bulk silicon (typically used as semiconductor substrates), which typically surrounds semiconductor devices. As a result, the buried oxide layer undesirably thermally insulates the device region in SOI substrates.

In view of the aforementioned disadvantages, there is a need for SOI devices of improved quality, particularly SOI devices having improved heat removal characteristics, and more efficient methods of making such SOI devices.

SUMMARY OF THE INVENTION

As a result of the present invention, an SOI substrate having improved heat removal characteristics is provided. By forming an SOI substrate according to the present invention, improved performance of devices subsequently formed on the SOI substrate is facilitated. Moreover, forming an SOI substrate in accordance with the present invention does not degrade or deleteriously effect the advantageous properties and characteristics commonly associated with SOI technology (improved speed performance at higher-operating frequencies, higher packing density, absence of latch-up, lower voltage applications, and higher "soft error" upset immunity).

In one embodiment, the present invention relates to a method of forming a Silicon-on-Insulator substrate involving the steps of providing a monocrystalline silicon substrate; patterning a mask over the monocrystalline silicon substrate thereby exposing a portion of the monocrystalline silicon substrate; implanting a first dosage of oxygen atoms in the exposed portion of the monocrystalline silicon substrate; removing the mask from the monocrystallinc silicon substrate; implanting a second dosage of oxygen atoms without using an implantation mask in the monocrystalline silicon substrate; and annealing the oxygen implanted monocrystalline silicon substrate to provide the Silicon-on-Insulator substrate.

In another embodiment, the present invention relates to a method of dissipating heat from a silicon device layer of a Silicon-on-Insulator substrate comprising a monocrystalline silicon layer, a buried oxide layer over the monocrystalline silicon layer, and the silicon device layer over the buried oxide layer involving the steps of forming the buried oxide layer by patterning a mask over the monocrystalline silicon layer thereby exposing a portion of the monocrystalline silicon layer; implanting a first dosage of oxygen atoms in the exposed portion of the monocrystalline silicon layer to form a discontinuous oxygen layer; removing the mask from the monocrystalline silicon layer; implanting a second dosage oxygen atoms in the monocrystalline silicon layer to form a substantially continuous oxygen layer; and annealing the substantially continuous oxygen layer to provide the Silicon-on-Insulator substrate, the buried oxide layer of the Silicon-on-Insulator substrate having a thin portion and a thick portion, wherein heat is dissipated through the thin portion of the buried oxide layer.

In yet another embodiment, the present invention relates to a Silicon-on-Insulator structure containing a monocrystalline silicon layer; a buried oxide layer over the monocrystalline silicon layer, the buried oxide layer including a first region having a first thickness and a second region having a second thickness, wherein the first thickness is from about 30% to about 70% smaller than the second thickness; a silicon device layer over the buried oxide layer; and a heat generating device on the silicon device layer and positioned over the first region of the buried oxide layer.

DISCLOSURE OF INVENTION

Figure 1:
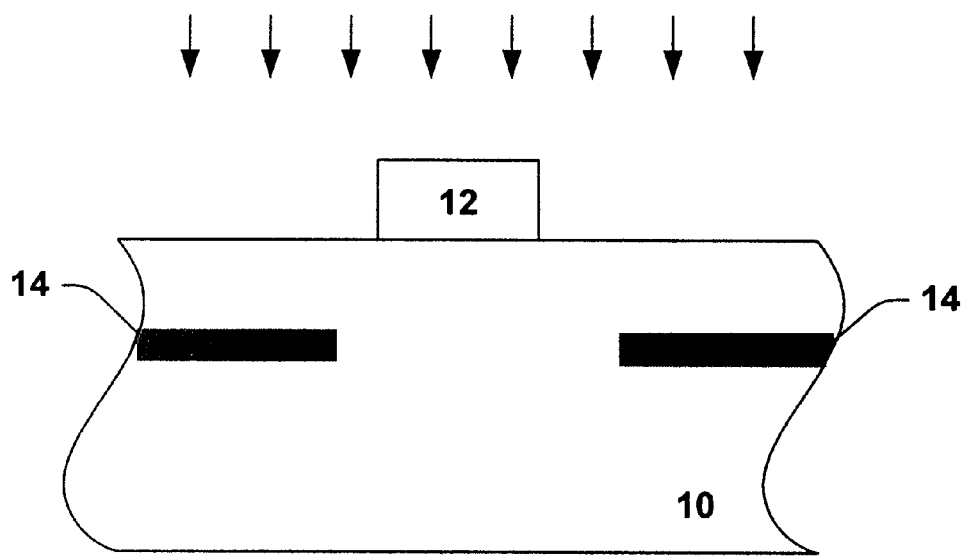
FIG. 1 is a cross-sectional view of the methods according to one embodiment of the present invention.

By forming an SOI substrate having improved heat removal characteristics, the performance of devices subsequently formed on the SOI substrate can be substantially improved. While not wishing to be bound to any theory, it is believed that by forming a buried oxide layer according to the present invention, it is consequently possible to increase the amount of heat that may be removed (and/or increase the rate at which heat may be removed or is dissipated) from the device layer of the SOI substrate. Increasing the removal of heat from the device layer consequently improves the performance and increases the life of devices, such as MOSFETs, formed on the device layer of the SOI substrate.

The SOI substrate according to the present invention is formed by modifying SIMOX (Separation by Implanted Oxygen) procedures. SIMOX procedures involve implanting oxygen in a silicon substrate to form a buried silicon oxide layer. The present invention involves selectively forming a relatively thin buried oxide layer in areas where self heating is not desirable, and forming a relatively thick buried oxide layer in other areas of the SOI substrate. In particular, the present invention involves identifying regions or areas on a silicon substrate that will or that are likely to support structures that generate heat, and then use less oxygen dopant in these regions or areas to selectively form a thin buried oxide layer. As a result of the methods of the present invention, there are relatively thick and relatively thin portions of the continuous buried oxide layer permitting increased heat dissipation in the areas associated with the relatively thin portions of the continuous buried oxide layer.

The present invention initially involves identifying regions or areas on a bulk or monocrystalline silicon substrate that, after all semiconductor processing is completed, are designated (or likely) to support structures that generate heat. Structures that generate heat include transistors, conductive lines, and the like. These "hot" regions typically correspond to predetermined circuit patterns.

A suitable mask such as a photoresist is formed (deposited and developed) over the hot regions of the silicon substrate. Alternatively, a suitable hardmask may be formed over the hot regions. The thickness and identity of the photoresist/hardmask is such that the photoresist/hardmask has the ability to block an oxygen implant species. An oxygen implantation step is performed thereby depositing oxygen atoms in a layer within the bulk silicon substrate. The layer of oxygen atoms is discontinuous, as the photoresist blocks the oxygen implants in certain areas. That is, the areas underneath the photoresist do not receive the oxygen implants.

In one embodiment, oxygen ions are implanted at an energy from about 10 KeV to about 1,000 KeV for a sufficient time to provide a dosage from about $1 \times 10^{13}$ atoms/cm$^2$ to about $1 \times 10^{20}$ atoms/cm$^2$. In another embodiment, oxygen ions are implanted at an energy from about 25 KeV to about 500 KeV for a sufficient time to provide a dosage from about $1 \times 10^{14}$ atoms/cm$^2$ to about $1 \times 10^{19}$ atoms/cm$^2$. In yet another embodiment, oxygen ions are implanted at an energy from about 50 KeV to about 300 KeV for a sufficient time to provide a dosage from about $1 \times 10^{15}$ atoms/cm$^2$ to about $1 \times 10^{18}$ atoms/cm$^2$.

The photoresist is then removed or stripped from the silicon substrate. Optionally, the previous two steps (namely; patterning a photoresist/hardmask and implanting an oxygen species) are repeated, typically using a different phoroesist pattern, one or more times. If an optional oxygen implantation step using a photoresist/hardmask is employed, the same ranges of energies and dosages described above are followed. In most embodiments, however, the previous two steps are not repeated.

A blanket oxygen implantation step is then performed. The same ranges of energies and dosages described above are followed (in one embodiment, oxygen ions are implanted at an energy from about 10 KeV to about 1,000 KeV for a sufficient time to provide a dosage from about $1 \times 10^{13}$ atoms/cm$^2$ to about $1 \times 10^{20}$ atoms/cm$^2$). As a result of the blanket oxygen implantation step, the buried layer of oxygen atoms becomes continuous, as there is no structure to block the oxygen implants. The continuous layer of oxygen atoms has at least two different thicknesses. The number of different thicknesses typically varies corresponding to the number of implantation steps.

After the oxygen implantation steps, the substrate is annealed to convert the buried layer of oxygen atoms to a buried silicon dioxide layer. The buried silicon dioxide layer has different thicknesses (at least about two different thicknesses) corresponding to the thicknesses of the buried layer of oxygen atoms.

Annealing is conducted at a temperature and time sufficient to convert the layer of buried oxygen atoms to a buried silicon dioxide layer. In one embodiment, annealing is conducted at a temperature from about 600° C. to about 1,500° C. In another embodiment, annealing is conducted at a temperature from about 700° C. to about 1,400° C. In yet another embodiment, annealing is conducted at a temperature from about 800° C. to about 1,300° C. In one embodiment, annealing is conducted for a time from about 2 minutes to about 1,000 minutes. In another embodiment, annealing is conducted for a time from about 5 minutes to about 500 minutes. In yet another embodiment, annealing is conducted for a time from about 10 minutes to about 200 minutes.

In one embodiment, the methods of making an SOI substrate according to the present invention include at least two oxygen implantation steps. In another embodiment, the present invention includes at least three oxygen implantation steps. In one embodiment, the SOI substrate according to the present invention includes a buried oxide layer having at least two different thicknesses. In another embodiment, the SOI substrate according to the present invention includes a buried oxide layer having at least three different thicknesses.

In one embodiment, the relatively thick portions of the buried oxide layer (generally corresponding to the areas not previously covered by a photoresist during the first oxygen implantation step) have a thickness from about 500 Å to about 5,000 Å and the relatively thin portions of the buried oxide layer (generally corresponding to the areas covered by a photoresist during the first oxygen implantation step) have a thickness from about 100 Å to about 4,000 Å. In another embodiment, the relatively thick portions of the buried oxide layer have a thickness from about 750 Å to about 4,500 Å and the relatively thin portions of the buried oxide layer have a thickness from about 250 Å to about 3,500 Å. In yet another embodiment, the relatively thick portions of the buried oxide layer have a thickness from about 1,000 A to about 4,000 Å and the relatively thin portions of the buried oxide layer have a thickness from about 500 Å to about 3,000 Å.

In one embodiment, the relatively thin portions of the buried oxide layer have a thickness that is from about 10% to about 90% smaller than the relatively thick portions. In another embodiment, the relatively thin portions of the buried oxide layer have a thickness that is from about 20% to about 80% smaller than the relatively thick portions. In yet another embodiment, the relatively thin portions of the buried oxide layer have a thickness that is from about 30% to about 70% smaller than the relatively thick portions.

In embodiments where there are three or more different thicknesses in the buried oxide layer, the above described relatively thick and thin thickness parameters refer to the thickest and thinnest portions of the three or more different thicknesses. That is, additional thickness portions of the buried oxide layer have thicknesses at or between the parameters described above.

The resultant SOI substrate has a bulk silicon layer, an insulation layer containing silicon dioxide having at least two different thicknesses, and a silicon device layer. Various structures and devices are formed on the silicon device layer. The silicon device layer, in one embodiment, has a thickness from about 500 Å to about 5,000 Å. In another embodiment, the silicon device layer has thickness from about 1,000 Å to about 3,000 Å.

Structures and devices that generate heat, such as transistors and conductive lines, are preferably formed over portions of the SOI substrate that overlie the relatively thin portions of the insulation layer. Silicon dioxide does not have a high thermal conductivity, so it acts as a heat insulator. Specifically, bulk or monocrystalline silicon has a higher thermal conductivity than silicon dioxide. When structures and devices that generate heat are formed over the relatively thin portions of the insulation layer, increased amounts of heat are dissipated through the thin insulation layer into the bulk silicon layer compared to structures and devices formed over conventional insulation layers or the relatively thick portions of the insulation layer. That is, heat generated over a thin portion of the buried oxide layer is dissipated more quickly compared to a heat generated over a thick portion of the buried oxide layer because the thermal conductivity of bulk silicon is higher than the thermal conductivity of silicon dioxide. The localized build-up of heat around such heat generating objects with the SOI substrate does not occur or is minimized by the present invention.

Referring to the Figures, a specific embodiment of the present invention is described. Specifically referring to FIG. 1, a bulk or monocrystalline silicon substrate 10 is provided. A photoresist 12 (or hardmask) is formed over the certain regions of the bulk silicon substrate 10. In particular, a photoresist material is deposited, irradiated with light, and developed to form a pattern. An oxygen implantation step is performed (as indicated by the arrows) thereby depositing oxygen atoms in a layer 14 within the bulk silicon substrate 10. The oxygen atoms are implanted at an energy of about 200 KeV for a sufficient time to provide a dosage of about $6\times10^{17}$ atoms/cm$^2$. The layer 14 of oxygen atoms is discontinuous, as the photoresist 12 blocks the oxygen implants in certain areas.

Figure 2:
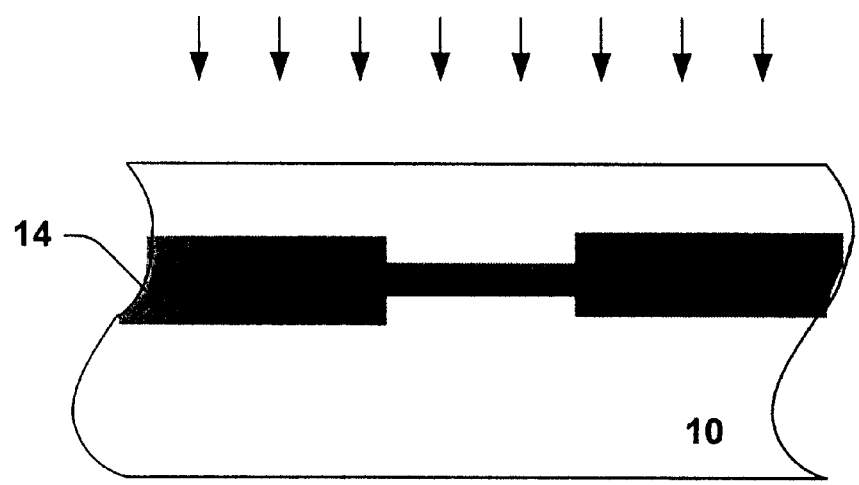
FIG. 2 is a cross-sectional view of the methods according to one embodiment of the present invention.

Referring to FIG. 2, the photoresist 12 is removed from the bulk silicon substrate 10. A blanket oxygen implantation step is then performed (as indicated by the arrows). The oxygen atoms are implanted at an energy of about 200 KeV for a sufficient time to provide a dosage of about $6\times10^{17}$ atoms/cm$^2$ in the thin areas (the middle of layer 14, corresponding to the area under the photoresist 12) and about $9\times10^{17}$ atoms/cm$^2$ in the thick areas (the left and right portions of layer 14). The buried layer 14 of oxygen atoms becomes continuous as a result of this step. The continuous layer 14 of oxygen atoms has two different thicknesses. The portion of the buried layer 14 of oxygen atoms in the area underneath the previously removed photoresist 12 (see FIG. 1) is thinner than the portion of the buried layer 14 of oxygen atoms in the area not underneath the previously removed photoresist 12.

Figure 3:
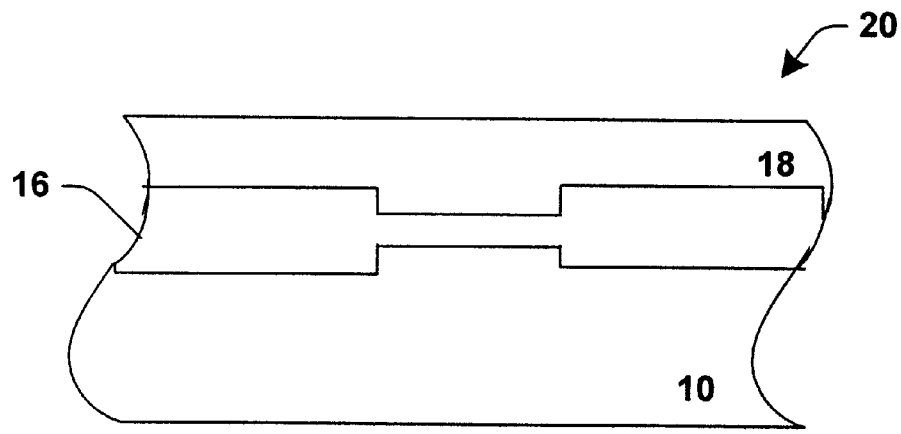
FIG. 3 is a cross-sectional view of an SOI substrate according to one embodiment of the present invention.

Referring to FIG. 3, the structure is annealed to convert the buried layer 14 of oxygen atoms to a buried silicon dioxide layer 16. The annealing is conducted at a temperature of about 1,200° C. for a time of about 100 minutes. The buried silicon dioxide layer 16 has a thickness of about 2,000 Å in the thin portion (the area underneath the previously removed photoresist 12) and a thickness of about 4,000 Å in the thick portions (the areas not underneath the previously removed photoresist 12). In this connection, the relatively thin portions of the buried silicon dioxide layer 16 have a thickness that is about 50% smaller than the relatively thick portions. Above the buried silicon dioxide layer 16 is silicon device layer 18. The thickness of the silicon device layer 18 is about 2,000 Å over the thick portions of the buried silicon dioxide layer 16 and about 3,000 Å over the thin portions of the buried silicon dioxide layer 16. After annealing, an SOI substrate 20 is produced.

Figure 4:
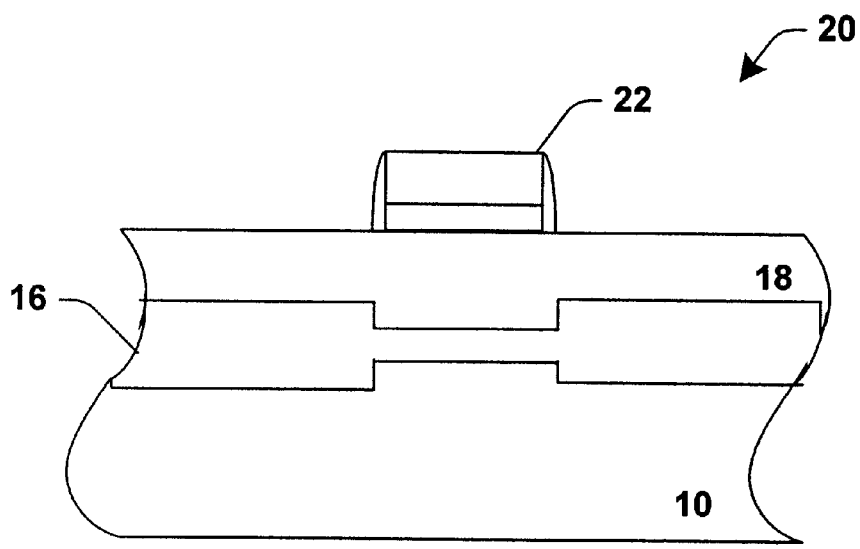
FIG. 4 is a cross-sectional view of an SOI substrate according to another embodiment of the present invention.

Referring to FIG. 4, a heat generating device 22, such as a MOSFET, is formed over the SOI substrate 20 using known semiconductor processes. Alternatively, any heat generating device or structure may be formed on the SOI substrate 20. Preferably, the heat generating device 22 is formed on the silicon device layer 18 of the SOI substrate 20 that is located over a thin portion of the buried silicon dioxide layer 16. Heat generated by MOSFET 22 located over a thin portion of the buried silicon dioxide layer 16 is dissipated more quickly compared to a heat generating device (not shown) located over a thick portion of the buried silicon dioxide layer 16 because the thermal conductivity of bulk silicon is higher than the thermal conductivity of silicon dioxide.

FIGS. 3 and 4 show an SOI substrate 20 having a buried silicon dioxide layer 16 having two thicknesses. However, SOI substrate 20 may have a buried silicon dioxide layer with about three or more thicknesses.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a Silicon-on-Insulator substrate, comprising:

providing a monocrystalline silicon substrate;

patterning a mask over the monocrystalline silicon substrate thereby exposing a portion of the monocrystalline silicon substrate;

implanting a first dosage of oxygen atoms in the exposed portion of the monocrystalline silicon substrate;

removing the mask from the monocrystalline silicon substrate;

implanting a second dosage of oxygen atoms without using an implantation mask in the monocrystalline silicon substrate; and annealing the oxygen implanted monocrystalline silicon substrate to provide the Silicon-on-Insulator substrate.

2. The method of claim 1, wherein implanting the first dosage of oxygen atoms is conducted at an energy from about 10 KeV to about 1,000 KeV to provide a dosage from about $1\times10^{13}$ atoms/cm$^2$ to about $1\times10^{20}$ atoms/cm$^2$.

3. The method of claim 1, wherein implanting the second dosage of oxygen atoms is conducted at an energy from about 10 KeV to about 1,000 KeV to provide a dosage from about $1\times10^{13}$ atoms/cm$^2$ to about $1\times10^{20}$ atoms/cm$^2$.

4. The method of claim 1, wherein annealing is conducted at a temperature from about 600° C. to about 1,500° C. for a time from about 5 minutes to about 500 minutes.

5. The method of claim 1, wherein the mask is at least one of a photoresist and a hardmask.

6. The method of claim 1, wherein the Silicon-on-Insulator substrate has a buried oxide layer having a thick portion and a thin portion, the thick portion of the buried oxide layer has a thickness from about 750 Å to about 4,500 Å and the thin portion of the buried oxide layer has a thickness from about 250 Å to about 3,500 Å.

7. The method of claim 1, further comprising patterning a second mask over the monocrystalline silicon substrate thereby exposing a second portion of the monocrystalline silicon substrate, implanting another dosage of oxygen atoms in the exposed second portion of the monocrystalline silicon substrate, and removing the second mask from the monocrystalline silicon substrate prior to implanting oxygen atoms without using an implantation mask.

8. A method of dissipating heat from a silicon device layer of a Silicon-on-Insulator substrate comprising a monocrystalline silicon layer, a buried oxide layer over the monocrystalline silicon layer, and the silicon device layer over the buried oxide layer, comprising:

forming the buried oxide layer by;

patterning a mask over the monocrystalline silicon layer thereby exposing a portion of the monocrystalline silicon layer;

implanting a first dosage of oxygen atoms in the exposed portion of the monocrystalline silicon layer to form a discontinuous oxygen layer;

removing the mask from the monocrystalline silicon layer;

implanting a second dosage oxygen atoms in the monocrystalline silicon layer to form a substantially continuous oxygen layer; and annealing the substantially continuous oxygen layer to provide the Silicon-on-Insulator substrate, the buried oxide layer of the Silicon-on-Insulator substrate having a thin portion and a thick portion, wherein heat is dissipated through the thin portion of the buried oxide layer.

9. The method of claim 8, wherein the thick portion of the buried oxide layer has a thickness from about 750 Å to about 4,500 Å and the thin portion of the buried oxide layer has a thickness from about 250 Å to about 3,500 Å.

10. The method of claim 8, wherein implanting the first dosage of oxygen atoms is conducted at an energy from about 25 KeV to about 500 KeV for a sufficient time to provide a dosage from about $1\times10^{14}$ atoms/cm$^2$ to about $1\times10^{19}$ atoms/cm$^2$.

11. The method of claim 8, wherein implanting the second dosage of oxygen atoms is conducted at an energy from about 25 KeV to about 500 KeV for a sufficient time to provide a dosage from about $1\times10^{14}$ atoms/cm$^2$ to about $1\times10^{19}$ atoms/cm$^2$.

12. The method of claim 8, wherein annealing is conducted at a temperature from about 700° C. to about 1,400° C. for a time from about 5 minutes to about 500 minutes.

13. The method of claim 8, wherein the thick portion of the buried oxide layer has a thickness from about 1,000 Å to about 4,000 Å and the thin portion of the buried oxide layer has a thickness from about 500 Å to about 3,000 Å.

14. The method of claim 1, wherein implanting the first dosage of oxygen atoms is conducted at an energy from about 25 KeV to about 500 KeV for a sufficient time to provide a dosage from about $1\times10^{14}$ atoms/cm$^2$ to about $1\times10^{19}$ atoms/cm$^2$.

15. The method of claim 1, wherein implanting the second dosage of oxygen atoms is conducted at an energy from about 25 KeV to about 500 KeV for a sufficient time to provide a dosage from about $1\times10^{14}$ atoms/cm$^2$ to about $1\times10^{19}$ atoms/cm$^2$.

16. The method of claim 8, wherein the mask is at least one of a photoresist and a hardmask.

17. The method of claim 8, further comprising patterning a second mask over the monocrystalline silicon substrate thereby exposing a second portion of the monocrystalline silicon substrate, implanting another dosage of oxygen atoms in the exposed second portion of the monocrystalline silicon substrate, and removing the second mask from the monocrystalline silicon substrate prior to implanting oxygen atoms without using an implantation mask.

* * * * *